(12) United States Patent
Jezewski et al.

(10) Patent No.: US 9,514,983 B2
(45) Date of Patent: Dec. 6, 2016

(54) COBALT BASED INTERCONNECTS AND METHODS OF FABRICATION THEREOF

(71) Applicants: Christopher J. Jezewski, Hillboro, OR (US); James S. Clarke, Portland, OR (US); Tejaswi K. Indukuri, Hillsboro, OR (US); Florian Gstrein, Portland, OR (US); Daniel J. Zierath, Portland, OR (US)

(72) Inventors: Christopher J. Jezewski, Hillboro, OR (US); James S. Clarke, Portland, OR (US); Tejaswi K. Indukuri, Hillsboro, OR (US); Florian Gstrein, Portland, OR (US); Daniel J. Zierath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 177 days.

(21) Appl. No.: 13/730,184

(22) Filed: Dec. 28, 2012

(65) Prior Publication Data

US 2014/0183738 A1 Jul. 3, 2014

(51) Int. Cl.
| | |
|---|---|
| *H01L 23/52* | (2006.01) |
| *H01L 21/768* | (2006.01) |
| *H01L 23/522* | (2006.01) |
| *H01L 23/485* | (2006.01) |
| *H01L 23/532* | (2006.01) |

(52) U.S. Cl.
CPC ... *H01L 21/76841* (2013.01); *H01L 21/76843* (2013.01); *H01L 21/76847* (2013.01); *H01L 21/76871* (2013.01); *H01L 21/76877* (2013.01); *H01L 21/76879* (2013.01); *H01L 21/76883* (2013.01); *H01L 23/485* (2013.01); *H01L 23/5226* (2013.01); *H01L 23/53261* (2013.01); *H01L 23/53266* (2013.01); *H01L 23/53295* (2013.01); *H01L 2924/0002* (2013.01)

(58) Field of Classification Search
CPC ............... H01L 21/32053; H01L 21/76843
USPC ............................................... 257/751, 762
See application file for complete search history.

(56) References Cited

U.S. PATENT DOCUMENTS

| | | | |
|---|---|---|---|
| 7,432,200 B2 * | 10/2008 | Chowdhury et al. | 438/678 |
| 7,843,063 B2 | 11/2010 | Baker-O'Neal et al. | |
| 7,867,891 B2 | 1/2011 | O'brien et al. | |

(Continued)

FOREIGN PATENT DOCUMENTS

| | | |
|---|---|---|
| CN | 101687896 A | 3/2010 |
| KR | 10-2010-0127756 | 12/2010 |
| TW | 200945493 A1 | 11/2009 |
| WO | WO 2009/088522 A2 | 7/2009 |

OTHER PUBLICATIONS

Moffat et al. "Extreme Bottom-Up Superfilling of Through-Silicon-Vias by Damascene Processing: Suppressor Disruption, Positive Feedback and Turing Patterns", Journal of the Electrochemical Society, 159 (4) D208-D216 (2012).*

(Continued)

*Primary Examiner* — Andy Huynh
*Assistant Examiner* — Sitaramarao S Yechuri
(74) *Attorney, Agent, or Firm* — Blakely, Sokoloff, Taylor & Zafman LLP

(57) ABSTRACT

A metal interconnect comprising cobalt and method of forming a metal interconnect comprising cobalt are described. In an embodiment, a metal interconnect comprising cobalt includes a dielectric layer disposed on a substrate, an opening formed in the dielectric layer such that the substrate is exposed. The embodiment further includes a seed layer disposed over the substrate and a fill material comprising cobalt formed within the opening and on a surface of the seed layer.

19 Claims, 13 Drawing Sheets

(56) References Cited

U.S. PATENT DOCUMENTS

| | | | |
|---|---|---|---|
| 2002/0019127 A1* | 2/2002 | Givens | H01L 21/28518 438/637 |
| 2003/0071355 A1* | 4/2003 | Dubin | H01L 21/288 257/751 |
| 2007/0141826 A1* | 6/2007 | Chowdhury | H01L 21/288 438/618 |
| 2008/0044999 A1 | 2/2008 | Dubin et al. | |
| 2008/0254232 A1* | 10/2008 | Gordon | C07C 211/65 427/585 |
| 2010/0164119 A1* | 7/2010 | Takesako | H01L 21/02123 257/774 |
| 2010/0323517 A1* | 12/2010 | Baker-O'Neal | H01L 21/76873 438/653 |
| 2011/0062587 A1* | 3/2011 | Yang | H01L 21/76846 257/751 |
| 2011/0163449 A1* | 7/2011 | Kelly | H01L 21/2885 257/750 |
| 2011/0223772 A1* | 9/2011 | Mayer | C23C 18/1608 438/754 |
| 2012/0070981 A1 | 3/2012 | Clendenning et al. | |
| 2012/0153483 A1 | 6/2012 | Akolkar et al. | |

OTHER PUBLICATIONS

International Search Report and Written Opinion mailed Apr. 25, 2014 for PCT/US2013/075336 filed Dec. 16, 2013.

Notice Concerning Transmittal of International Preliminary Report on Patentability mailed Jul. 9, 2015 and Written Opinion of the International Searching Authority for PCT/US2013/075336 filed Dec. 16, 2013.

Office Action and Search Report from the Taiwan Intellectual Property Office dated Sep. 11, 2015 for Taiwan Patent Application No. 102147529 and English Translations thereof.

Hong Xiao, "Introduction to Semiconductor Manufacturing Technology", Prentice Hall, Upper Saddle River, New Jersey, Columbus, Ohio, 2001 2 pages.

Notice of Preliminary Rejection from the Korean Intellectual Property Office (KIPO) dated Mar. 1, 2016 for Korean Patent Application No. 10-2015-7012770.

First Office Action from the Chinese Patent Office dated Aug. 2, 2016 for Chinese Patent Application No. 201380062154.7.

Notice of Allowance from the Korean Intellectual Property Office (KIPO) dated Sep. 23, 2016 for Korean Patent Application No. 10-2015-7012770 (2 pages).

* cited by examiner

COBALT BASED INTERCONNECTS AND METHODS OF FABRICATION THEREOF

FIELD OF THE INVENTION

Embodiments of the present invention relate generally to metal interconnect structures and their methods of fabrication. More particularly, embodiments of the present invention relate to cobalt based interconnect structures and their methods of fabrication.

BACKGROUND OF THE INVENTION

Integrated circuit (IC) devices typically include circuit elements such as transistors, capacitors and resistors formed within or on a semiconductor substrate. Interconnect structures are used to electrically couple or connect the discrete circuit elements into functional circuits. Typical metal interconnects may include a line portion and a via portion.

Presently, interconnect structures are fabricated from copper, and may include a barrier layer such as titanium or tantalum or nitride materials such as tantalum nitride or titanium nitride, or a combination thereof (e.g., tantalum nitride/tantalum (TNT)). A problem with utilizing copper interconnect structures is that they are highly susceptible to electromigration which can lead to void formation and failure.

Tungsten metallization has been successfully used to fabricate front end contacts and, thus, has been suggested for back end metallization for interconnect fabrication. A desirable advantage with utilizing tungsten metallization is that it is highly resistant to detrimental electromigration effects. However, a disadvantage with utilizing tungsten metallization is that its electrical resistivity is higher than copper. More specifically, tungsten line resistances are 4 to 6 times higher than copper interconnects, and via resistances can be as much as 20% higher. These high resistances severely degrade integrated circuit performance and are therefore undesirable.

DETAILED DESCRIPTION OF THE INVENTION

Figure 1A:
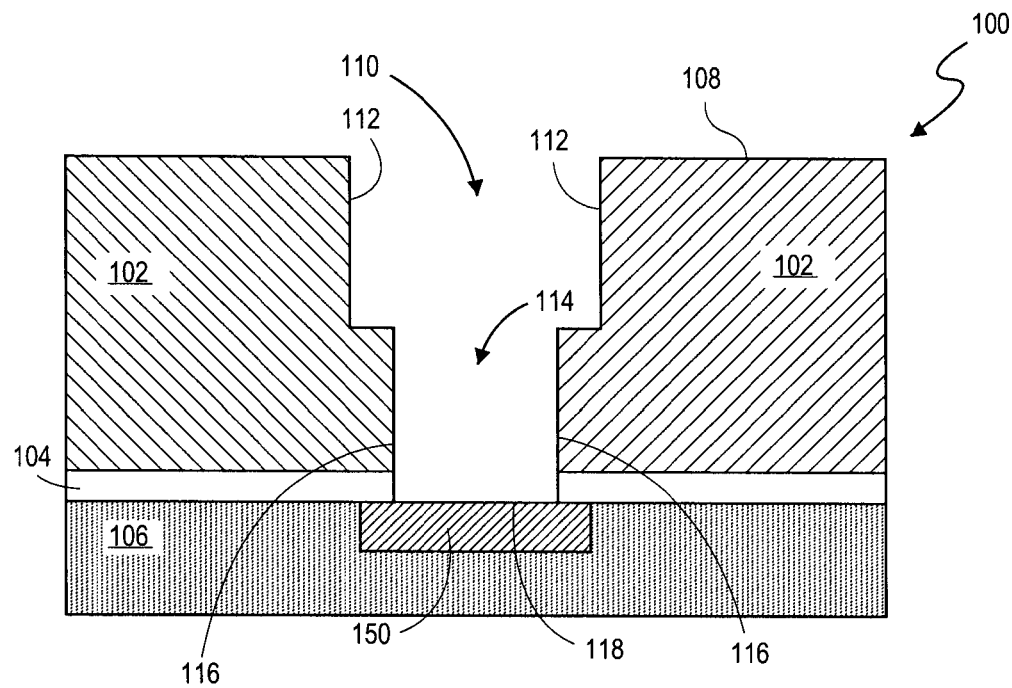
FIGS. 1A-1E are cross-sectional side view illustrations of a method of forming cobalt interconnects with a seed layer according to an embodiment of the present invention.

Embodiments of the present invention are directed to cobalt interconnects and methods of fabricating cobalt interconnects. It should be noted that in various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiments.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

One embodiment of the invention is a cobalt interconnect which includes a cobalt seed layer and a cobalt fill material. The seed layer is formed from a different composition and/or by a different process than that used to form the cobalt fill material. Another embodiment is a cobalt interconnect which includes a cobalt plug layer and a cobalt fill material. The plug layer is formed from a different composition and/or by a different process than that used to for the cobalt fill material. Such cobalt interconnects are advantageous since they have a low resistance (e.g., lower than tungsten) and are highly resistive to electromigration (e.g., more resistive to electromigration than copper), enabling fabrication of high performance interconnect structures. Another advantage is that cobalt interconnects do not need barrier layers which otherwise are used to prevent copper migration. As dimensions scale in conventional interconnect processing, the high resistance of such barrier layers can impact the performance of conventional copper interconnects to greater extents.

In a first aspect, a conformal cobalt-based seed layer is formed in an opening in a dielectric layer. A cobalt-based fill material is then deposited or grown on the cobalt-based seed layer to form a cobalt interconnect.

For example, FIGS. 1A-1F illustrate a method of forming a cobalt interconnect with a cobalt-containing seed layer and a cobalt-containing fill layer according to embodiments of the present invention. FIG. 1A illustrates a substrate 106 with top surface 118 that may be used as a substrate on which a cobalt interconnect can be formed. Substrate 106 can include any portion of a partially fabricated integrated circuit (IC) on which a cobalt interconnect is ultimately fabricated. For example, substrate 106 will typically include, or have formed thereon, active and passive devices. As depicted in FIG. 1A, a conductive region 150 is included in substrate 106, on to which a cobalt interconnect is ultimately formed. In one such embodiment, the substrate 106 has been processed through front end of line (FEOL), and the conductive region 150 is a diffusion region formed in a crystalline semiconductor substrate or layer, e.g., the conductive region is a source or drain region of a transistor. In another such embodiment, the conductive region 150 is an underlying metal line in a back end of line (BEOL) metallization structure, as is described in greater detail below in association with FIG. 2. Although embodiments may be ideally suited for fabricating semiconductor integrated circuits such as, but not limited to, microprocessors, memories, charge-coupled devices (CCDs), system on chip (SoC) ICs, or baseband processors, other applications can also include microelectronic machines, MEMS, lasers, optical devices, packaging layers, etc. Embodiments may also be used to fabricate individual semiconductor devices, e.g., a cobalt structure described herein may be used to fabricate a gate electrode of a metal oxide semiconductor (MOS) transistor.

Referring again to FIG. 1A, a dielectric layer 102 is formed above substrate 106. The dielectric layer 102 may be composed of any suitable dielectric or insulating material such as, but not limited to, silicon dioxide, SiOF, carbon-doped oxide, a glass or polymer material. An opening is formed in the dielectric layer. The opening exposes the conductive region 150, to which contact by a cobalt interconnect is ultimately made. In one embodiment, as depicted in FIG. 1A, the opening includes a lower opening 114 (e.g., a via hole or slot) with sidewalls 116 and an upper opening 110 (e.g., a metal line trench) with sidewalls 112, as is common in a dual damascene process. Although two openings are depicted, it is to be appreciated that a single opening may instead be formed in the dielectric layer 102, e.g., as is used in a single damascene approach where only a line or a via, but not both, is fabricated in a single operation. The opening or openings may be fabricated in dielectric layer 102 by well known lithography and etch processing techniques typically used in damascene and dual damascene type fabrication. Although only a single dielectric layer 102 is depicted, multiple layers of the same or differing dielectric materials may instead be used, e.g., a first dielectric layer having opening 114 therein, and a second dielectric layer having opening 112 therein. Additionally, in an embodiment, and as depicted in FIG. 1A, the dielectric layer 102 is formed on an etch stop layer 104 disposed on substrate 106. The etch stop layer 104 may be composed of a material such as silicon nitride or silicon oxynitride.

Figure 1B:
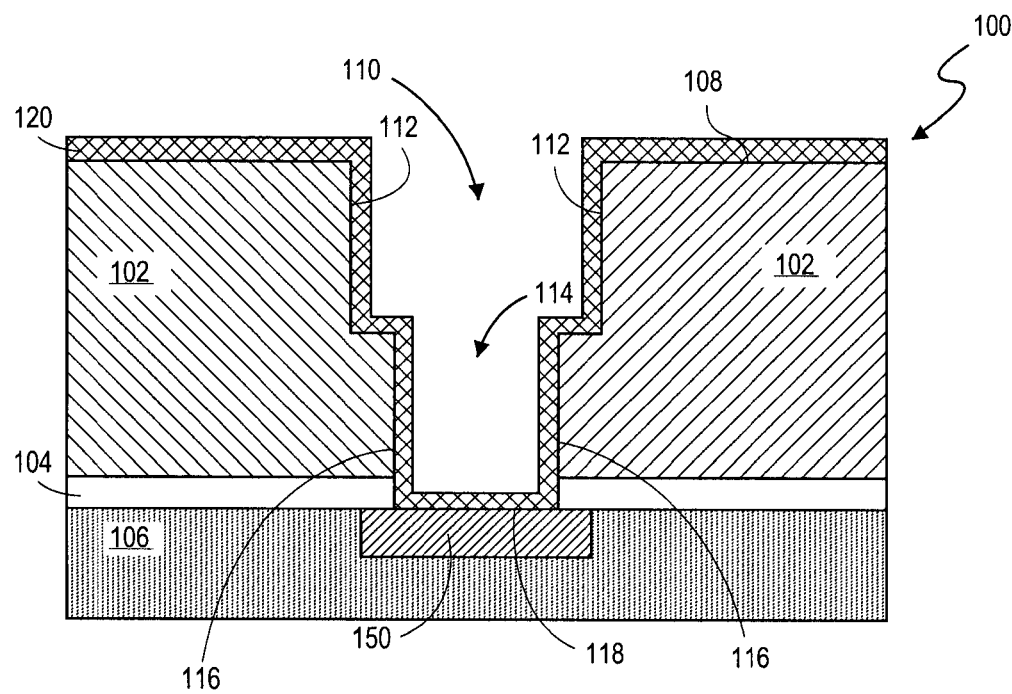

Referring to FIG. 1B, a cobalt seed layer 120 is deposited. It can be appreciated that prior to depositing the seed layer 120, an adhesion/barrier layer may be formed, e.g., a tantalum nitride/tantalum (TNT) layer or a titanium nitride/titanium layer. However, in another embodiment, no adhesion and/or barrier layer is used, and the seed layer 120 is formed directly on the dielectric layer 102 and directly on the conductive region 150. The seed layer 120 may be formed on a top surface 108 of the dielectric layer 102 as well as on the exposed top surface 118 of the substrate 106 (e.g., on conductive region 150). The cobalt seed layer 120 is also formed on the sidewalls 116 of the upper opening 114, and the sidewalls 112 of the lower opening 110.

Seed layer 120 may be a conformal layer composed of a material including cobalt. In one embodiment, the cobalt seed layer 120 is formed to a thickness less than 3 nm, and typically 1 nm to 3 nm. The seed layer 120 may act as a nucleation layer for the growth of subsequent fill materials. In one embodiment, the seed layer 120 is composed substantially of, if not entirely of, cobalt. For example, in a specific such embodiment, the seed layer is composed of at least 50% cobalt. As used herein, % of composition refers to atomic %. In a particular embodiment, the seed layer is composed of at least 90% cobalt. In any such cases, the non-cobalt remainder of the seed layer composition, if any, can include one or more of Al, Ni, Cu, Ag, Au, Mn, Ti, V, Cr, Fe, Ta, W, Ru, P, B, C, N, Si, Ge, Mg, Zn, Rh, Pt, Cd, Hf, In, Sn, C, O, Be, Ca, Zr, Nb, Mo, Ir, Re, or Pd. In another embodiment, the seed layer 120 is composed of a cobalt-based compound or alloy material. For example, in one embodiment, the seed layer 120 is composed of a dilute alloy composed of approximately 0.25-5% of a non-cobalt element, such as those listed above, with the remainder approximately 95+% cobalt, is used. Such a dilute alloy can involve, either during deposition or processing subsequent to deposition, migration of the non-cobalt species to surfaces or interfaces of the cobalt. The migration can provide a diffusion barrier for the cobalt and/or be used to enhance adhesion of the cobalt to other layers. Grain boundaries within the cobalt may also be filled by the non-cobalt species. In other embodiments, however, the seed layer 120 may include less than 50% cobalt, but still be referred to as a cobalt-based material. Exemplary embodiments of cobalt-based compound seed layers include cobalt silicide or cobalt germanide seed layers. In a specific such embodiment, conductive region 150 includes at least some germanium (e.g., an exposed doped silicon germanium or doped germanium region, or a metal germanide region), and the seed layer 120 is a compatible cobalt germanide layer. In another specific such embodiment, conductive region 150 includes at least some silicon (e.g., an exposed doped silicon region, or a metal silicide region), and the seed layer 120 is a compatible cobalt silicide layer. Exemplary embodiments of cobalt-based alloy seed layers include cobalt alloyed with one or more of the following: Al, Ni, Cu, Ag, Au, Mn, Ti, V, Cr, Fe, Ta, W, Ru, P, B, C, N, Si, Ge, Mg, Zn, Rh, Pt, Cd, Hf, In, Sn, C, O, Be, Ca, Zr, Nb, Mo, Ir, Re, or Pd. In the above described embodiments, the cobalt seed layer 120 may have a small grain structure.

The seed layer 120 may be deposited or grown by chemical vapor deposition (CVD), atomic layer deposition (ALD), physical vapor deposition (PVD), electroplating, electroless plating or other suitable process that deposits conformal thin films. In an embodiment, the cobalt seed layer 120 is deposited to form a high quality conformal layer that sufficiently and evenly covers all exposed surfaces within the openings and top surfaces. The high quality seed layer may be formed, in one embodiment, by depositing the cobalt seed material at a slow deposition rate to evenly and consistently deposit the conformal seed layer. By forming the seed layer 120 in a conformal manner, compatibility of a subsequently formed fill material with the underlying structure may be improved. Specifically, the seed layer 120 can assist a deposition process by providing appropriate surface energetics for deposition thereon.

Deposition recipes of thin films using processes such as CVD, ALD, and PVD may vary depending on the desired process time, thickness, and quality of conformity. For example, utilizing CVD to deposit the seed layer 120 may create a conformal thin film layer more quickly than it would take an ALD process to deposit the same layer; however, the quality of the thin film deposited by the CVD process may be lower than the quality of the thin film deposited by the ALD process. In another embodiment, the seed layer 120 is deposited by a PVD process. The PVD process may be performed with an increased distance between the receiving substrate and the corresponding sputter target to form a highly conformal thin film.

Figure 1C:
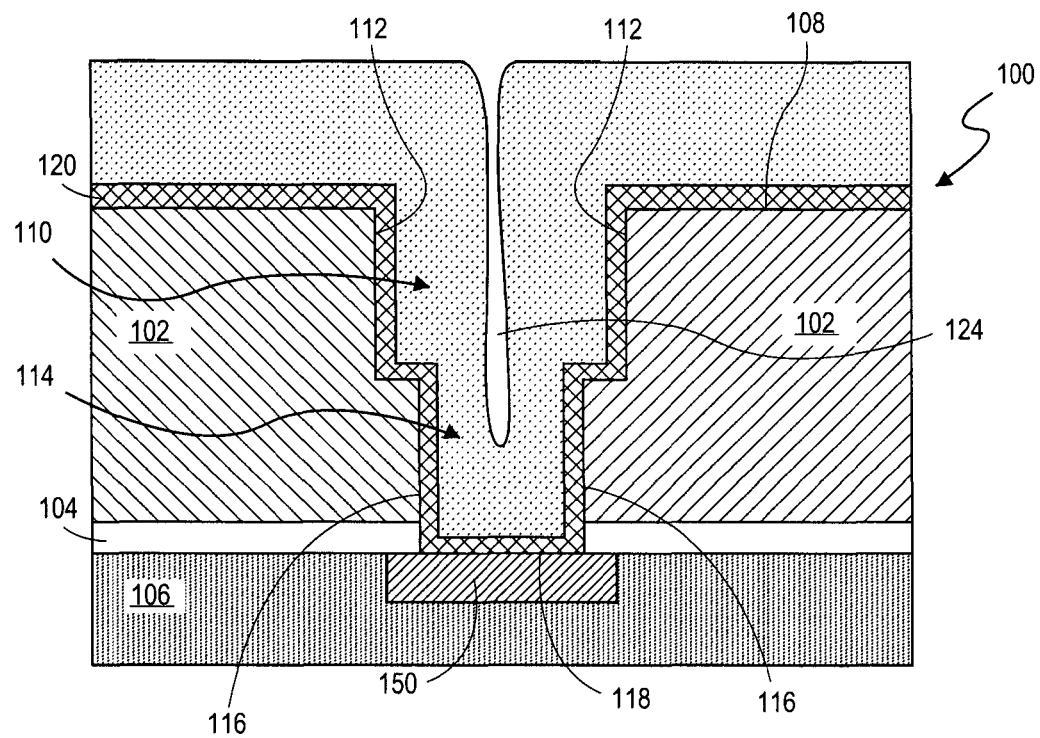

Referring to FIG. 1C, a fill material 122 may be formed on the exposed surfaces of the seed layer 120, such that the fill material 122 completely fills the openings 110 and 114 and is formed on the top surface of the cobalt seed layer 120 on the top surface 108 of dielectric 102. A seam 124 may be formed within the openings 110, 114 during to deposition of the fill material 122. In an embodiment, fill material 122 may be doped or alloyed with any of the aforementioned elements that can be alloyed with the seed layer 120. For example, in one embodiment, the fill material 122 is composed of a dilute alloy composed of approximately 0.25-5% of a non-cobalt element, such as those listed above, with the remainder approximately 95+% cobalt, is used. Such a dilute alloy can involve, either during deposition or processing subsequent to deposition, migration of the non-cobalt species to surfaces or interfaces of the cobalt. The migration can provide a diffusion barrier for the cobalt and/or be used to enhance adhesion of the cobalt to other layers. Grain boundaries within the cobalt may also be filled by the non-cobalt species. In one embodiment, the fill material 122 consists essentially only of cobalt. In another embodiment, the fill material 122 is at least 90% cobalt. In yet another embodiment, the fill material 122 is composed of at least 50% cobalt.

The fill material 122 may have a different composition than the seed layer 120. For example, the seed layer 120 may be composed of both silicon and cobalt, while the fill material 122 is composed of only cobalt. In another example, the seed layer 120 may be composed of a first cobalt-based alloy (such as those described above), while the fill material 122 is composed of a second, different, such cobalt-based alloy. In one embodiment, the fill material 122 may have a different grain structure than the seed layer 120. For example, the seed layer 120 may have a smaller grain structure than the grain structure of the fill material 122.

In an embodiment of the invention, the cobalt fill material 122 may be formed by a process such as, but not limited to, CVD, ALD, PVD, electroplating, or electro-less plating. In one embodiment, the process method used to form the fill material 122 may be different than the process used to form the seed layer 120. Furthermore, the seed layer 120 may be formed conformally, while the fill material 122 is formed in a non-conformal or bottom up approach. For example, the seed layer 120 may be formed by an ALD deposition process that forms a conformal layer on exposed surfaces of the receiving substrate, while the fill material 122 may be formed by PVD process that directionally sputters the fill material onto the surfaces of the seed layer 120, with greater deposition rates on flat surfaces as opposed to on sidewall surfaces. In another example, the seed layer 120 may be formed by an ALD deposition process that forms a conformal layer on exposed surfaces of the receiving substrate, while the fill material 122 may be formed by an electroplating process that grows the fill material from the surfaces of the seed layer 120. In yet another example, the seed layer 120 may be formed by a CVD deposition process and the fill material may be formed by a PVD process.

In another embodiment, the seed layer 120 and the fill material 122 may be deposited by the same process (e.g. ALD, CVD, or PVD) but with different sets of deposition parameters, such as pressure, deposition rate, temperature, etc. For example, the seed layer 120 and the fill material 122 may be deposited by a CVD process; however, the set of parameters used in the CVD processing for the seed layer, such as deposition pressure and temperature, may be different than the set of parameters used in the CVD processing for the fill material 122. In another example, the seed layer and the fill material are formed by a PVD process, but the seed layer may be formed by a PVD process with a larger distance between the target and the receiving substrate than the PVD process used to form the fill material. In another embodiment, the metal fill material is formed by a colummated PVD process, while the seed layer is formed by a non-colummated PVD process. Or alternatively, the seed layer is formed by an ALD process with a lower deposition rate than the deposition rate of the ALD process used to form the fill material 122 such that the seed layer 120 is formed more conformally than the fill material 122.

Figure 1D:
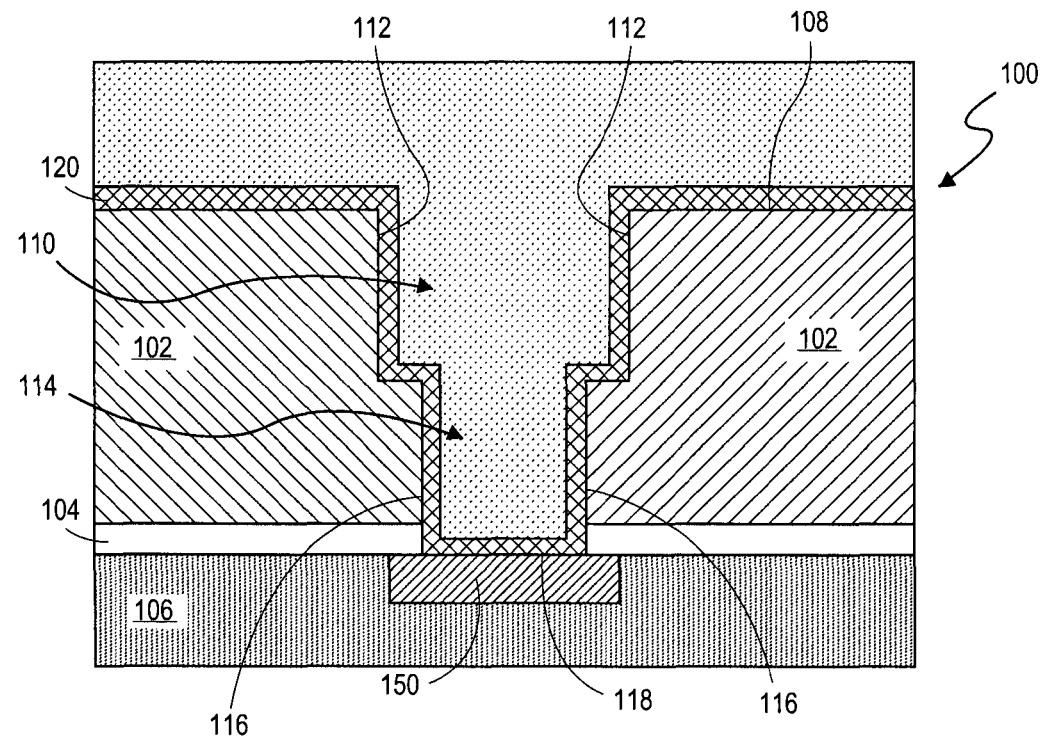

Referring to FIG. 1D, an anneal process may optionally be performed to reflow the deposited interconnect layer. The seam 124 from FIG. 1C may be removed subsequent to the anneal process, forming a solid structure within openings 110 and 114 within dielectric layer 102. The anneal process may help grow larger grain structures within the fill material 122, decreasing resistivity and expelling impurities from poor grain structures. In one embodiment, the anneal process uses forming gas, such as gasses, including but not limited to, nitrogen, hydrogen, and argon. Furthermore, the anneal process may be performed at a temperature less than the thermal budget of the backend structures. For example, in one embodiment, the anneal process is performed at a temperature of 300° C. to 400° C. In another embodiment, the anneal process is performed at a temperature that is higher than the melting point of fill material 122 but lower than the thermal budget of the backend structures.

In yet another embodiment, a cycling technique may optionally be utilized to deposit the interconnect layer 122 within the openings 114 and 110 without the seam 124. One cycle may involve one deposition of the fill material 122 and one anneal process. The anneal operation of one cycle may be set at a temperature and time duration to briefly reflow the fill material to improve step coverage. The deposition operation of one cycle may be a short deposition to deposit less fill material, such that several operations are required to completely fill the via and line openings 114 and 110. In one embodiment, less than 5 cycles are needed to deposit the fill material 122 without a seam 124.

Figure 1E:
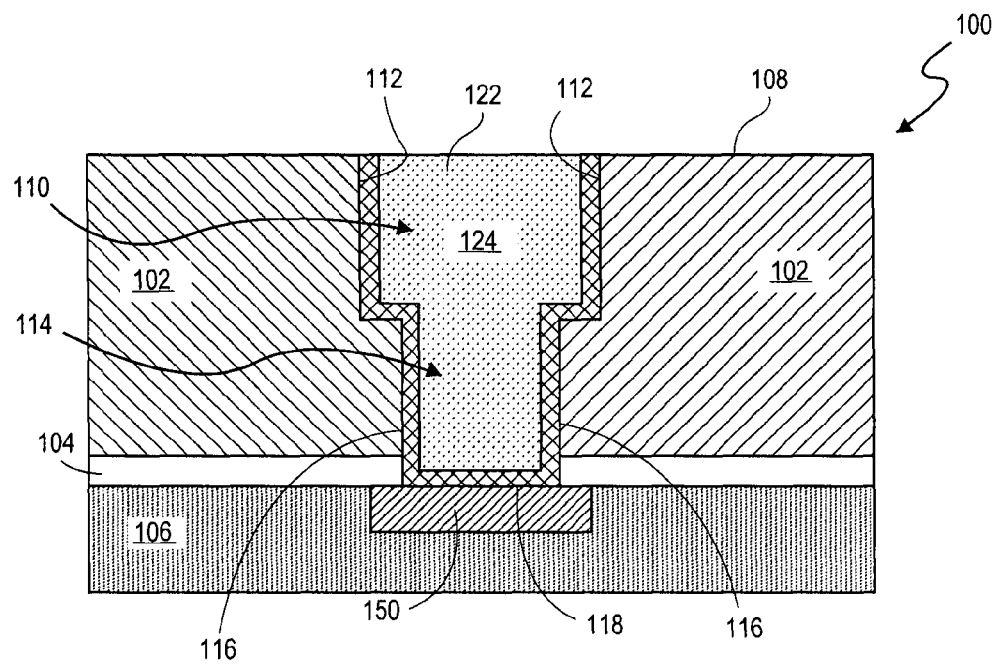

Referring to FIG. 1E, a chemical mechanical planarization (CMP) process may be performed to remove the fill material 122 and the seed layer 120 disposed above the top surface 108 of the dielectric layer 102. In one embodiment, the CMP process may be a timed CMP process that is timed to stop at the top surface 108 of the line dielectric layer. In another embodiment, the CMP process may utilize the top surface 108 of the line dielectric layer as a stopping layer. Because the thickness of the fill material deposited above the top surface of the line dielectric layer may vary, utilizing the top surface 108 as a stopping layer may be a more reliable method. In an alternative embodiment, an etch process is used to remove the fill material 122 and the seed layer 120 disposed above the top surface 108 of the dielectric layer 102.

Figure 2:
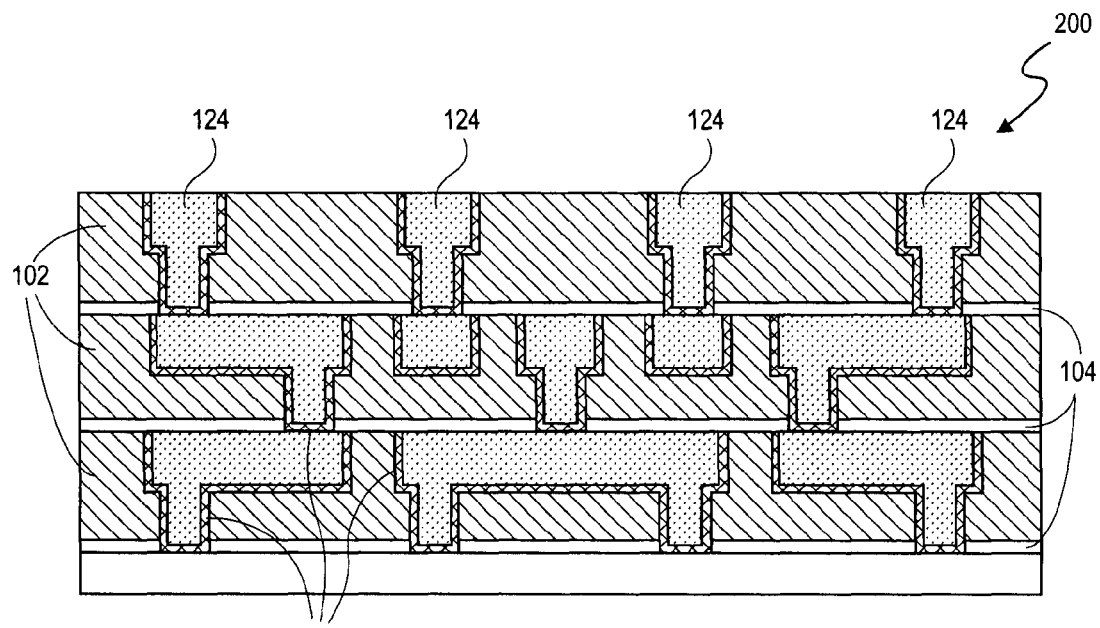
FIG. 2 is a cross-sectional side-view illustration of an integrated circuit with multiple metallization layers formed with cobalt interconnects with seed layers according to an embodiment of the invention.

FIG. 2 illustrates a cross-section 200 of a portion an IC structure with cobalt metal interconnects according to an embodiment of the present invention. A stack of dielectric layers 102 includes metal interconnects 124 having seed layers 120 and metal fill layers 124. The portion of the IC structure shown in FIG. 2 can be a portion of a back end of line (BEOL) metallization structure as found, e.g., in a microprocessor die or memory die.

Figure 3:
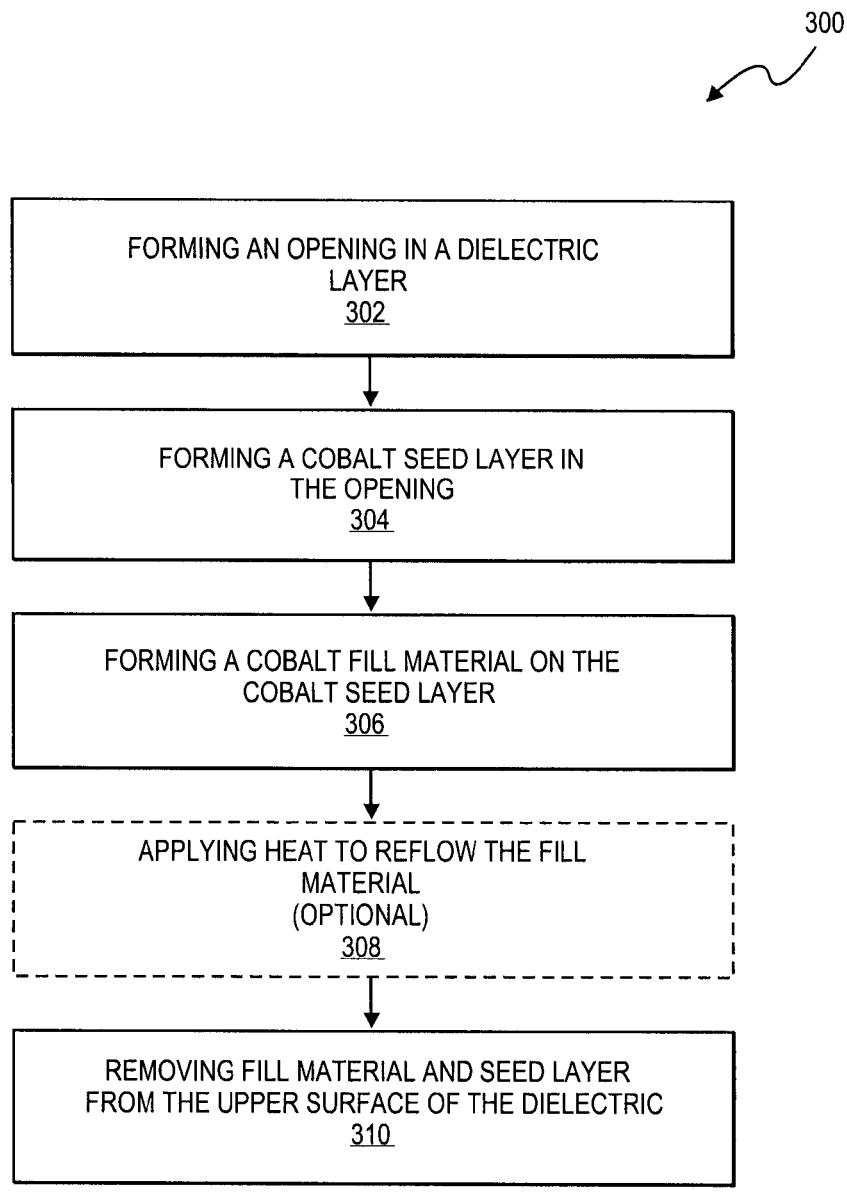
FIG. 3 is a flow chart illustrating a method of forming cobalt interconnects with a seed layer according to an embodiment of the present invention.

FIG. 3 is a flow chart 300 illustrating a method of forming a cobalt metal interconnect according to an embodiment of the present invention. At 302, an opening is formed in a dielectric layer to expose a conductive region in a substrate. At 304, a cobalt seed layer is formed over the substrate, in contact with the conductive region, as well as over the dielectric layer and on sidewalls of the opening. At 306, a fill material is formed on the seed layer and fills the opening. The fill material is composed of a cobalt-based material. At 308, in an optional embodiment, heat is applied to reflow the fill material. At 310, the fill material and seed layer material disposed above an upper surface of the dielectric layer are removed. In one such embodiment, the fill material and the seed layer both include cobalt, but have different material compositions. In another such embodiment, the fill material and the seed layer both include cobalt, but are formed by different deposition or growth techniques. In yet another such embodiment, the fill material and the seed layer both include cobalt, but have different material compositions and are formed by different deposition or growth techniques.

In a second aspect, a cobalt-based plug is formed in a lower portion (e.g., a via hole or slot) of an opening in a dielectric layer. A cobalt-based conductive line is then formed on the cobalt-based plug, in an upper portion (e.g., a metal line trench) of the opening, to form a cobalt interconnect.

Figure 4A:
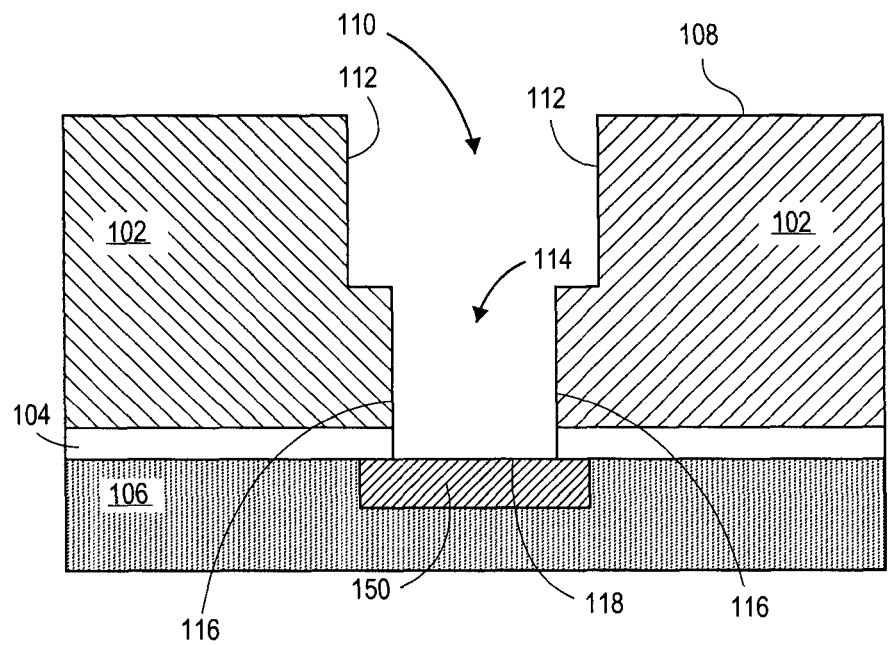
FIGS. 4A-4F are cross-sectional side view illustrations of a method of forming cobalt interconnects with a cobalt plug according to an embodiment of the invention.

For example, FIGS. 4A-4F illustrate another method of forming a cobalt metal interconnect according to an embodiment of the invention. As depicted in FIG. 4A, the method begins with the same structure as illustrated and described in association with FIG. 1A.

Figure 4B:
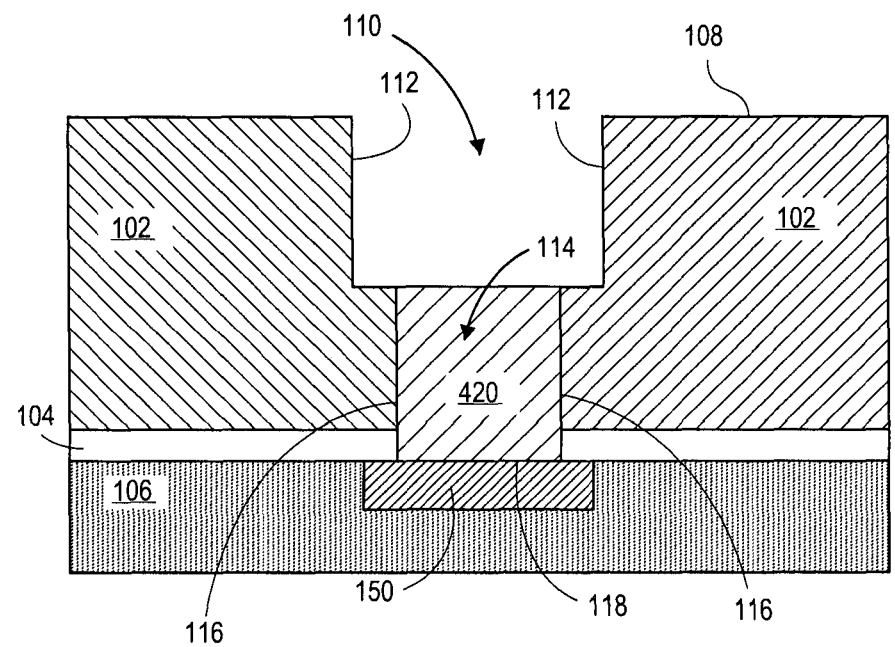

Referring to FIG. 4B, a plug 420 is formed on conductive region 150 of substrate 106. In an embodiment, as depicted, the plug 420 is formed only within the lower opening 114 of the dielectric layer 102 such that the lower opening 114 is completely filled with plug material 420. In another embodiment, however, the top surface of the plug 420 may not be planar with the top surface of the lower opening 114. For example, the top surface of the plug 420 may be higher or lower than the top surface of the lower opening. In another embodiment, the top surface of the plug 420 may form a mushroom-like dome as a result of the growth profile during formation of plug 420.

In an embodiment, plug 420 is formed in a bottom-up approach. That is, the plug 420 is not formed by conformal deposition over the structure of FIG. 4A. For example, in one embodiment, the formation of plug 420 is performed by selectively depositing on, and then growing from, the surface of the conductive region 150. In a specific embodiment, the plug 420 is formed by electrolessly plating the plug material onto an exposed and compatible surface of the conductive region 150. As an example, the conductive region 150 has an upper metalized or metal-containing surface such as cobalt (Co), copper (Cu) or Tungsten (W), and a cobalt-based plug 420 is formed by electroless deposition involving bottom-up growth from the metalized or metal-containing surface of conductive region 150. In such processes, the metalized or metal-containing surface of conductive region 150 is used as a nucleation site for the material of plug 420. In other embodiments, other suitable bottom-up fill and growth deposition approaches may be used such as, but not limited to, electroplating. A bottom-up fill approach is one in which a deposition rate is faster on planar or flat surfaces than on vertical sidewall surfaces.

The plug 420 may be a cobalt-based plug composed of at least 50% cobalt. As used herein, % of composition refers to atomic %. In a particular embodiment, the plug 420 is composed of at least 90% cobalt. In any such cases, the non-cobalt remainder of the plug 420 composition, if any, can include one or more of Al, Ni, Cu, Ag, Au, Mn, Ti, V, Cr, Fe, Ta, W, Ru, P, B, C, N, Si, Ge, Mg, Zn, Rh, Pt, Cd, Hf, In, Sn, C, O, Be, Ca, Zr, Nb, Mo, Ir, Re, or Pd. In another embodiment, the plug 420 is composed of a cobalt-based compound or alloy material. For example, in one embodiment, the plug 420 is composed of a dilute alloy composed of approximately 0.25-5% of a non-cobalt element, such as those listed above, with the remainder approximately 95+% cobalt, is used. Such a dilute alloy can involve, either during deposition or processing subsequent to deposition, migration of the non-cobalt species to surfaces or interfaces of the cobalt. The migration can provide a diffusion barrier for the cobalt and/or be used to enhance adhesion of the cobalt to other layers. Grain boundaries within the cobalt may also be filled by the non-cobalt species. In other embodiments, however, the plug 420 may include less than 50% cobalt, but still be referred to as a cobalt-based material. Exemplary embodiments of cobalt-based compound plug 420 materials include cobalt silicide or cobalt germanide plug materials. In a specific such embodiment, conductive region 150 includes at least some germanium (e.g., an exposed doped silicon germanium or doped germanium region, or a metal germanide region), and the plug 420 material is a compatible cobalt germanide layer. In another specific such embodiment, conductive region 150 includes at least some silicon (e.g., an exposed doped silicon region, or a metal silicide region), and the plug 420 material is a compatible cobalt silicide layer. Exemplary embodiments of cobalt-based alloy plug 420 materials include cobalt alloyed with one or more of the following: Al, Ni, Cu, Ag, Au, Mn, Ti, V, Cr, Fe, Ta, W, Ru, P, B, C, N, Si, Ge, Mg, Zn, Rh, Pt, Cd, Hf, In, Sn, C, O, Be, Ca, Zr, Nb, Mo, Ir, Re, or Pd. In the above described embodiments, the cobalt plug 420 may have a small grain structure.

Figure 4C:
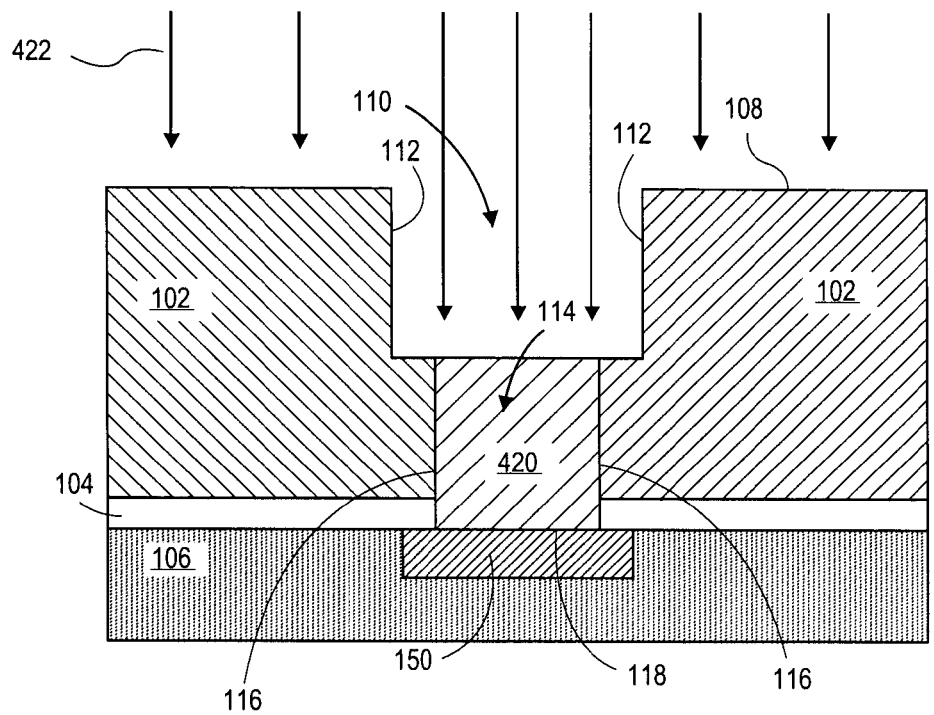

Referring to FIG. 4C, pretreatment 422 may optionally be performed on the exposed top surface of the plug 420 and the top surface 108 of the dielectric layer 102. Pretreatment may be performed by a plasma process or ion bombardment to enhance adhesion of a later formed compound to the treated surface. In one embodiment, pretreatment may be performed in a plasma chamber at a temperature ranging from room temperature up to approximately 300° C. for approximately 20 to 60 seconds utilizing, e.g., a $H_2$/He plasma or an Ar plasma. In another embodiment, the pretreatment may include argon ion bombardment. It is to be understood that such pretreatment may be performed at other stages of the process flow, e.g., prior to forming seed layers and/or plug materials.

Figure 4D:
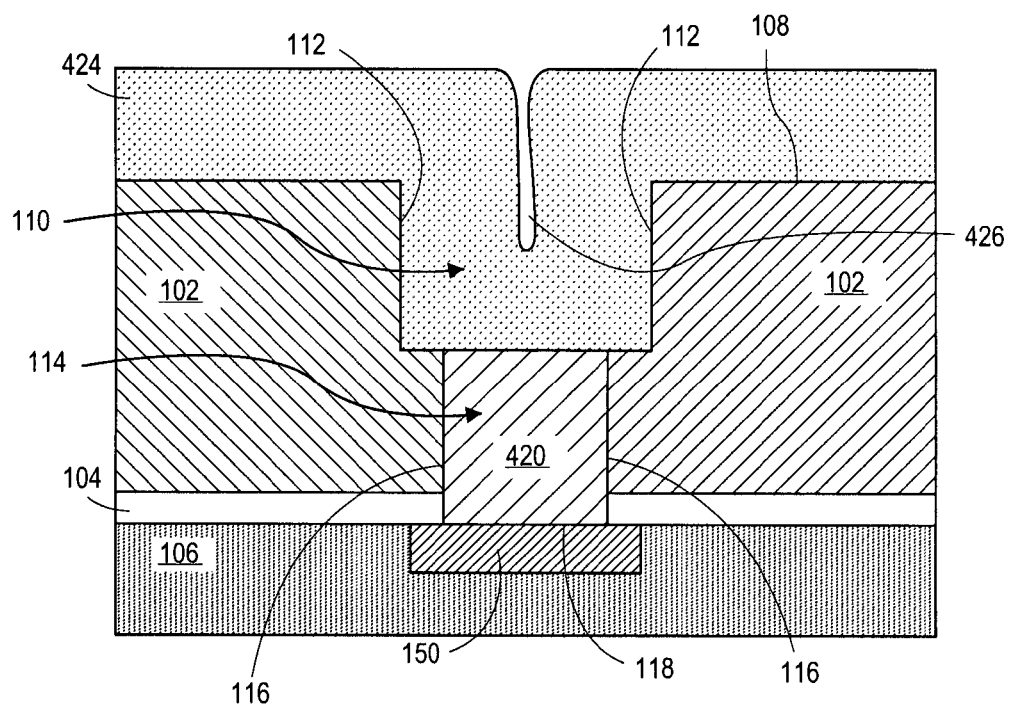

Referring to FIG. 4D, a fill material 424 is formed on the plug 420, within upper opening 110, and on the top surface 108 of the dielectric layer 102. A seam 426 may be formed within the upper opening 110 subsequent to deposition of the fill material 424. In one embodiment, fill material 424 is composed of a material comprising cobalt. For example, fill material may be composed of, and deposited by, materials and processes described above for fill material 122. Furthermore, the fill material 424 may differ from the plug 420 material by composition and/or deposition technique in manners similar to those described above for optional differences between seed layer 120 and fill material 122.

Figure 4E:
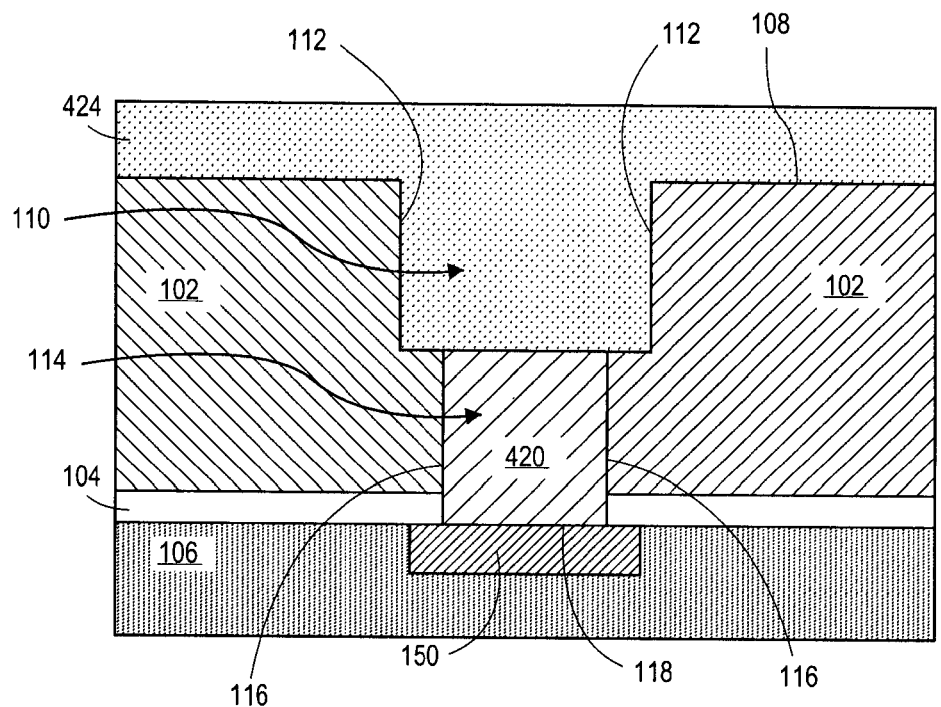

Referring to FIG. 4E, an anneal process may optionally be performed to reflow the deposited fill material 424. The seam 426 from FIG. 4D may be removed subsequent to the anneal process, forming a solid structure within openings 110 and 114 within dielectrics layer 102. The anneal process may enable growth of larger grain structures within the fill material 424, decreasing resistivity and expelling impurities from otherwise poor grain structures. In one embodiment, the anneal process involves use of a forming gas such as, but not limited to, nitrogen, hydrogen, or argon. Furthermore, the anneal process may be performed at a temperature less than the thermal budget of the backend structures. For example, in one embodiment, the anneal process is performed at a temperature of 300° C. to 400° C. In another embodiment, the anneal process is performed at a temperature that is higher than the melting point of fill material 424 but lower than the thermal budget of the backend structures.

In yet another embodiment, a cycling technique is optionally utilized to deposit the fill material 424 within the opening 110 without the seam 426. One cycle may involve a single deposition of the fill material 424 and a single anneal process. The anneal operation of one cycle may be set at a temperature and time duration to briefly reflow the fill material 424 to improve step coverage. The deposition operation of one cycle may be a short deposition to deposit less fill material 424, such that several operations are required to completely fill the upper opening 110. In one embodiment, less than 5 cycles are needed to deposit the fill material 424 without a seam 426.

Figure 4F:
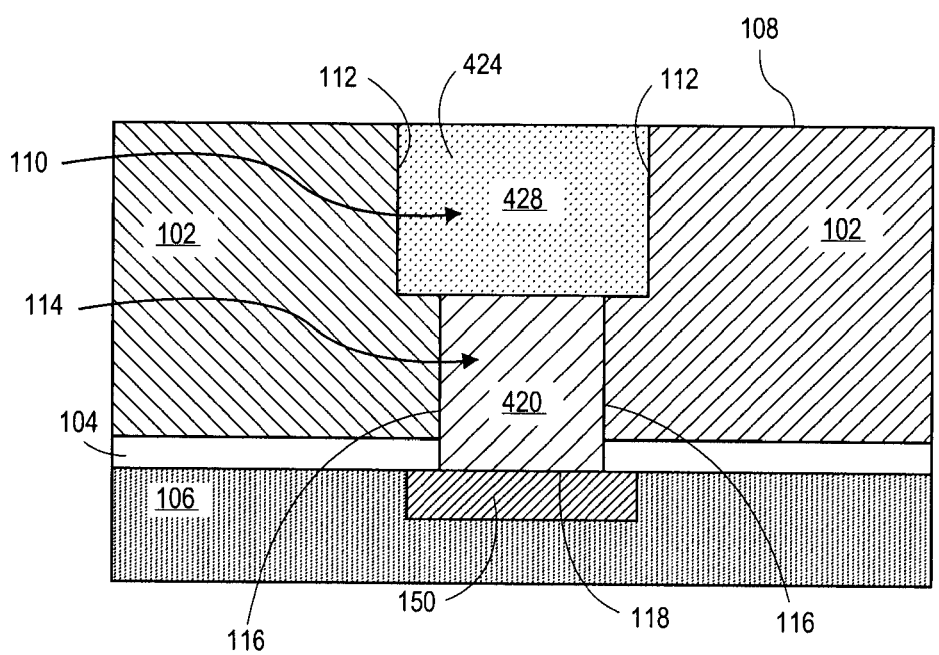

Referring to FIG. 4F, a CMP process may be performed to remove the fill material 424 above the top surface 108 of the dielectric layer 102 to provide the cobalt-based structure 428. In one embodiment, the CMP process may be a timed CMP process that is timed to stop at the top surface 108 of the line dielectric layer. In another embodiment, the CMP process may utilize the top surface 108 of the dielectric layer 102 as a stopping layer. Because the thickness of the fill material deposited above the top surface 108 of the dielectric layer 102 may vary, utilizing the top surface 108 as a stopping layer may be a more reliable method. In an alternative embodiment, an etch process is used to remove the fill material 424 above the top surface 108 of the dielectric layer 102.

In a third aspect, a cobalt-based plug is formed in a lower portion (e.g., a via hole or slot) of an opening in a dielectric layer. A cobalt-based seed layer is next formed in an upper portion (e.g., a metal line trench) of the opening, over the cobalt-based plug. A cobalt-based conductive line is then formed on the cobalt-based seed layer to fill the upper portion of the opening, to form a cobalt interconnect.

Figure 5A:
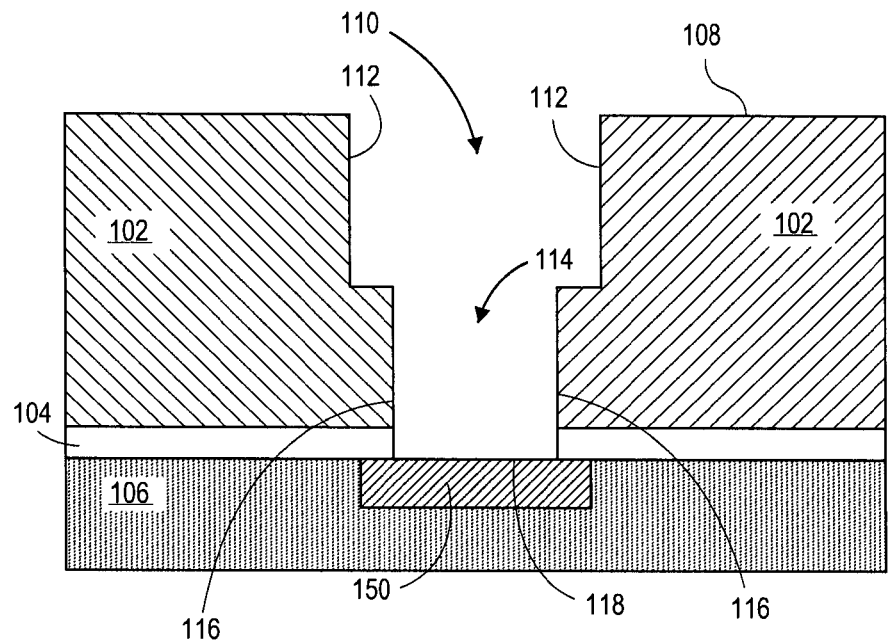
FIGS. 5A-5F are cross-sectional side view illustrations of a method of forming cobalt interconnects with a cobalt plug and a seed layer according to an embodiment of the invention.

For example, FIGS. 5A-5F illustrate a method of forming a cobalt interconnect with a cobalt containing seed layer and a cobalt containing fill layer according to an embodiment of the invention. As depicted in FIG. 5A, the method begins with the same structure as illustrated and described in association with FIG. 1A. Next, referring to FIG. 5B, the cobalt-based plug 420 described in association with FIG. 4B is formed in the lower opening 114 of the dielectric layer 102, on the conductive region 150 of substrate 106. Thus, the resulting structure of FIG. 5B may be as described above for the structure of FIG. 4B.

Figure 5B:
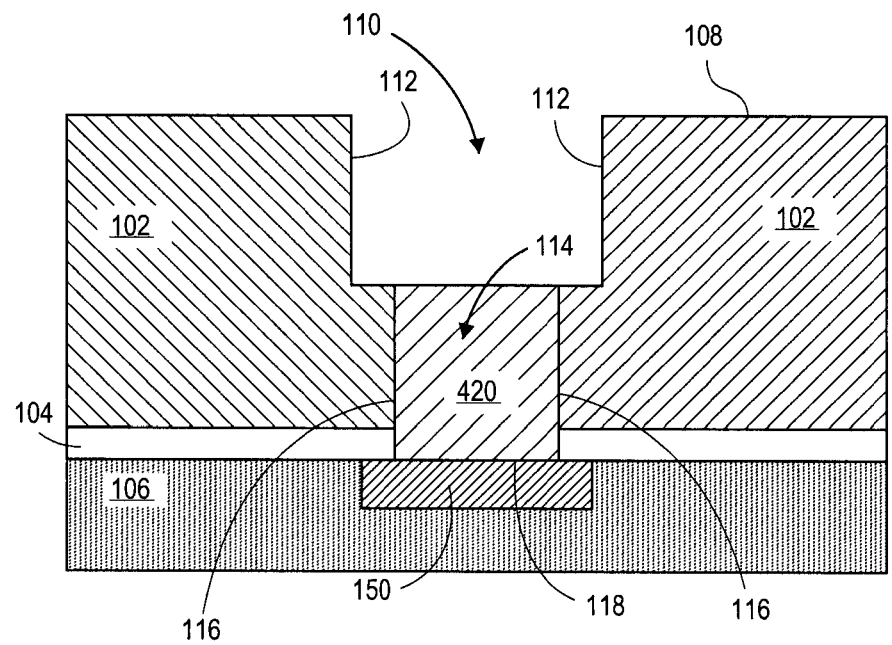
Figure 5C:
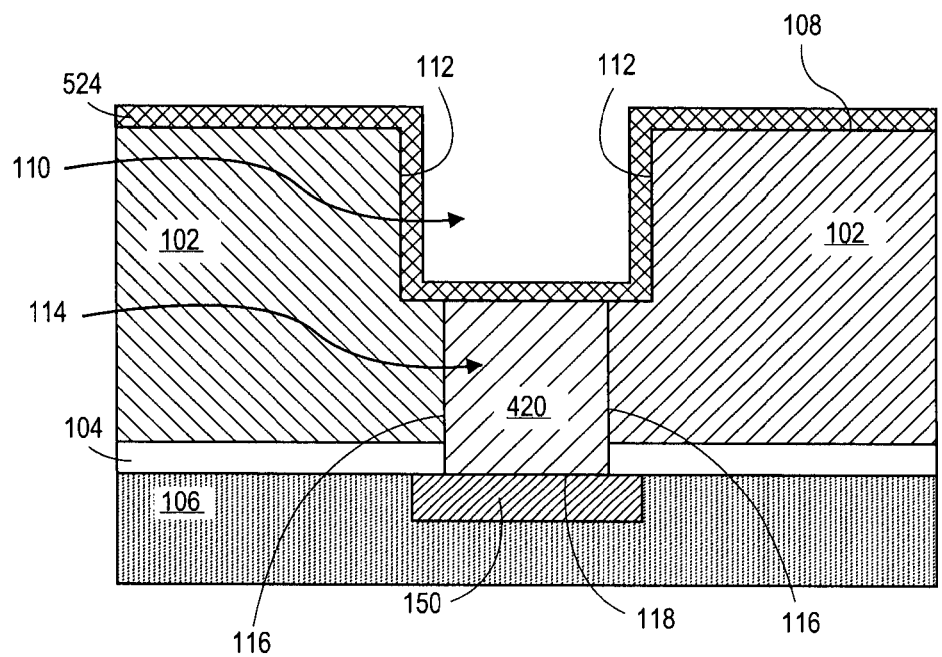

Referring to FIG. 5C, a cobalt-based seed layer 524 is deposited conformally with the structure of FIG. 5B. For example, in one embodiment, the cobalt-based seed layer 524 is formed in the upper opening 114 of the dielectric layer 102 and on the exposed plug 420. The composition and method of forming the seed layer 524 may be as described for seed layer 120 of FIG. 1B. Furthermore, as also described in association with FIG. 1B, prior to depositing the seed layer 524, a barrier layer may be formed.

Figure 5D:
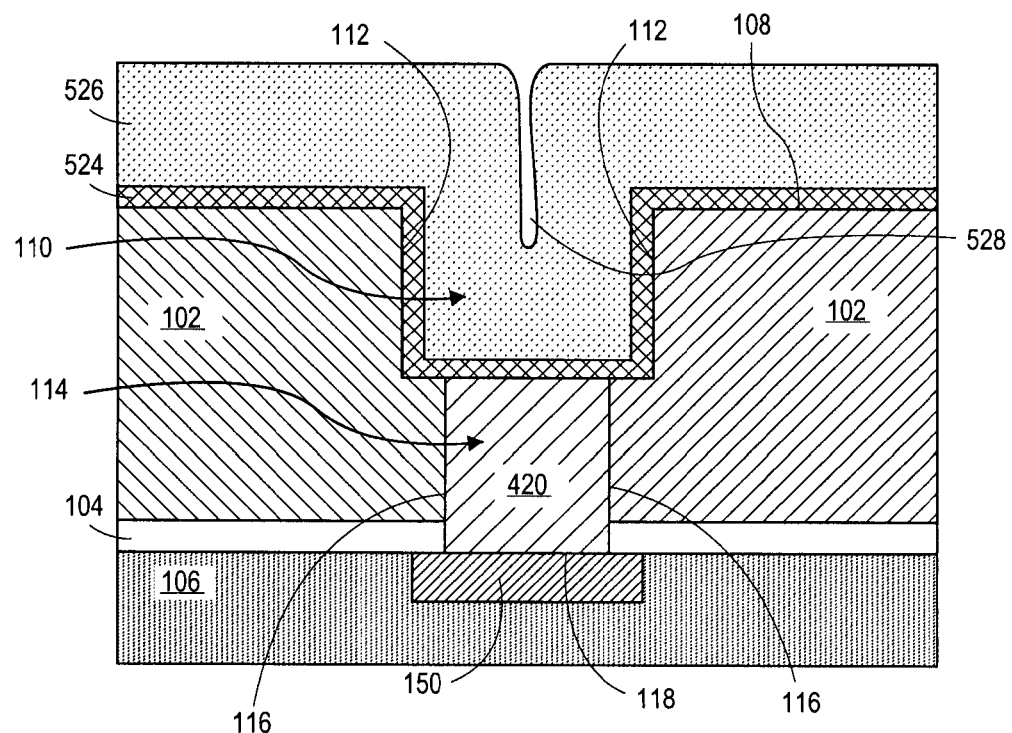

Referring to FIG. 5D, a fill material 526 is formed on the seed layer 524, within upper opening 110, and on the top surface 108 of the dielectric layer 102. A seam 528 may be formed within the opening 110 subsequent to deposition of the fill material 526. The composition and method of forming the fill material layer 526 may be as described for fill material 122 of FIG. 1C. Furthermore, the fill material 526 may differ from the seed layer 524 material by composition and/or deposition technique in manners similar to those described above for optional differences between fill material 122 and seed layer 120. Furthermore, although in an embodiment, the plug 420, the seed layer 524 and the fill material 526 are all cobalt-based, they may all differ from one another by composition and/or deposition technique, as is described above for optional differences between fill material 122 and seed layer 120 and between fill material 424 and plug 420.

Figure 5E:
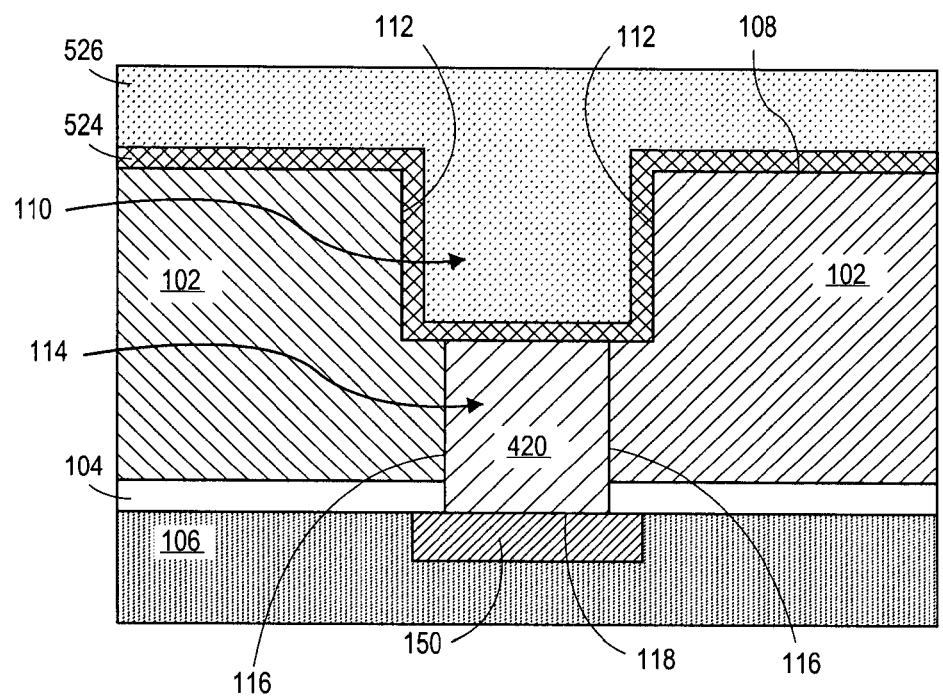

Referring to FIG. 5E, an anneal process may optionally be performed to reflow the deposited fill material 526. The seam 528 from FIG. 5D may be removed subsequent to the anneal process, forming a solid structure within opening 110 of dielectric layer 102. The anneal process may enable growth of larger grain structures within the fill material 526, decreasing resistivity and expelling impurities from poor grain structures. In one embodiment, the anneal process involves the use of a uses forming gas such, but not limited to, nitrogen, hydrogen, or argon. Furthermore, the anneal process may be performed at a temperature less than the thermal budget of the backend structures. For example, in one embodiment, the anneal process is performed at a temperature of 300° C. to 400° C. In another embodiment, the anneal process is performed at a temperature that is higher than the melting point of fill material 526 but lower than the thermal budget of the backend structures.

In yet another embodiment, a cycling technique may be utilized to deposit the fill material 526 within the opening 110 without the seam 528. One cycle may involve one deposition of the fill material 526 and one anneal process. The anneal operation of one cycle may be set at a temperature and time duration to briefly reflow the fill material to improve step coverage. The deposition operation of one cycle may be a short deposition to deposit less fill material, such that several operations are required to completely fill the opening 510. In one embodiment, less than 5 cycles are needed to deposit the fill material 526 without a seam 528.

Figure 5F:
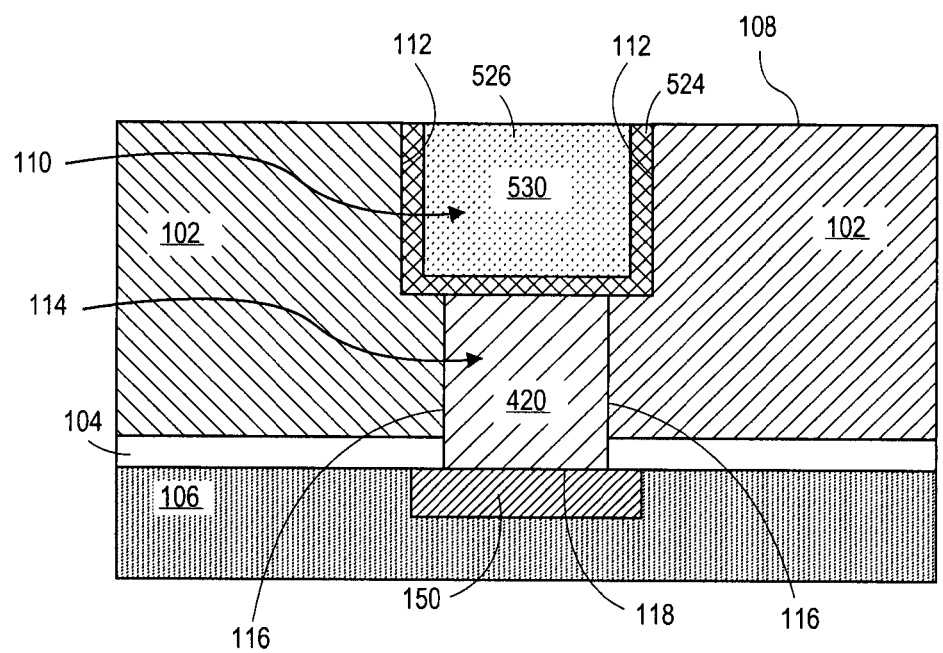

Referring to FIG. 5F, a CMP process may be performed to remove the fill material 526 and the seed layer 524 disposed above the top surface 108 of the dielectric layer 102 to provide the cobalt-based structure 530. In one embodiment, the CMP process may be a timed CMP process that is timed to stop at the top surface 108 of the dielectric layer 102. In another embodiment, the CMP process may utilize the top surface 108 of the dielectric layer 102 as a stopping layer. Because the thickness of the fill material deposited above the top surface 108 of the dielectric layer 102 may vary, utilizing the top surface 108 as a stopping layer may be a more reliable method. In an alternative embodiment, an etch process is used to remove the fill material 526 and the seed layer 524 disposed above the top surface 108 of the dielectric layer 102.

Figure 6:
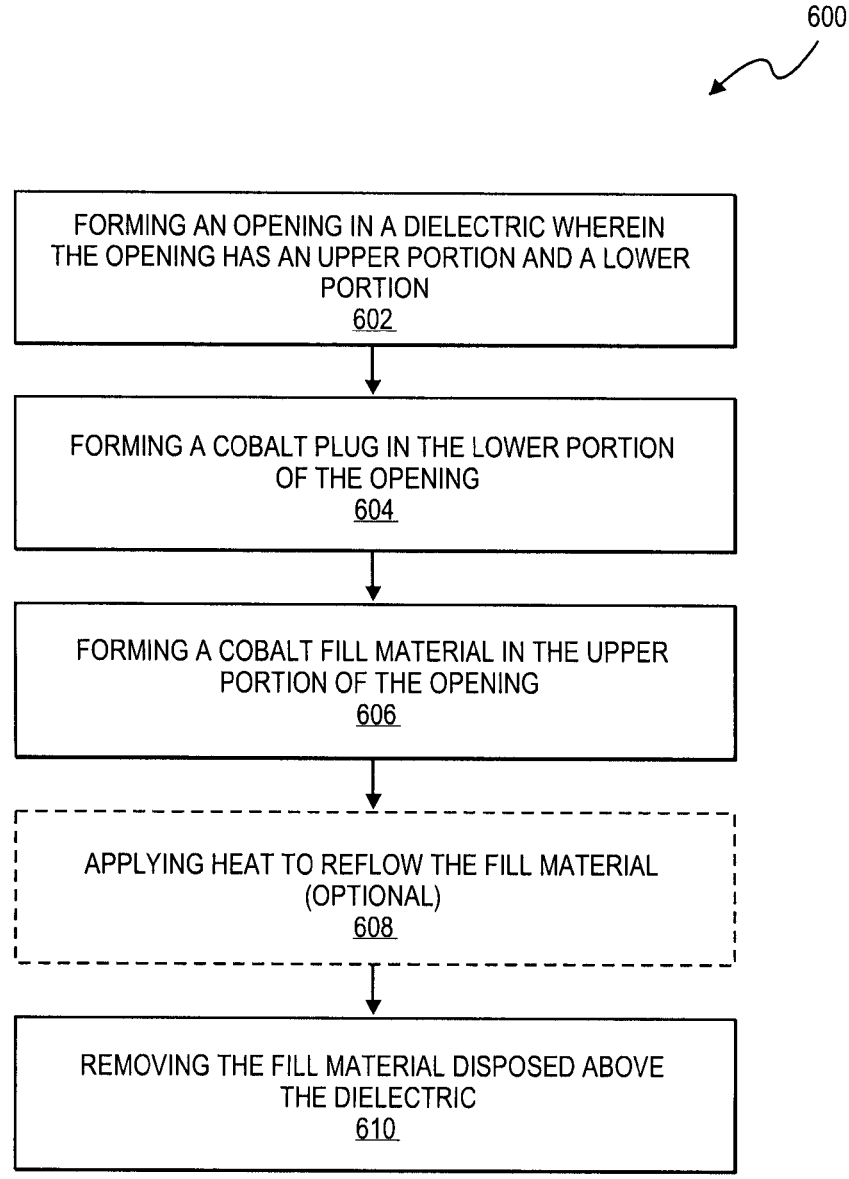
FIG. 6 is a flow chart illustrating a method of forming cobalt interconnects with a cobalt plug according to an embodiment of the invention.

FIG. 6 is a flow chart 600 illustrating a method of forming a cobalt metal interconnect according to an embodiment of the present invention. At 602, an opening is formed in a dielectric layer to expose a conductive region in a substrate. At 604, a cobalt plug is formed in a lower portion of the opening, in contact with the conductive region. At 606, a fill material is formed on the plug and fills the opening. The fill material is composed of a cobalt-based material. At 608, in an optional embodiment, heat is applied to reflow the fill material. At 610, the fill material disposed above an upper surface of the dielectric layer is removed. In one such embodiment, the fill material and the plug both include cobalt, but have different material compositions. In another such embodiment, the fill material and the plug both include cobalt, but are formed by different deposition or growth techniques. In yet another such embodiment, the fill material and the plug both include cobalt, but have different material compositions and are formed by different deposition or growth techniques. In another embodiment, a seed layer is formed between the plug and the fill material. The seed layer may also be a cobalt-based layer.

In a fourth aspect, a metal gate electrode of a semiconductor device is composed, as least partially, of cobalt. That is, embodiments of the present invention need not be limited to forming cobalt-based interconnects.

Figure 7:
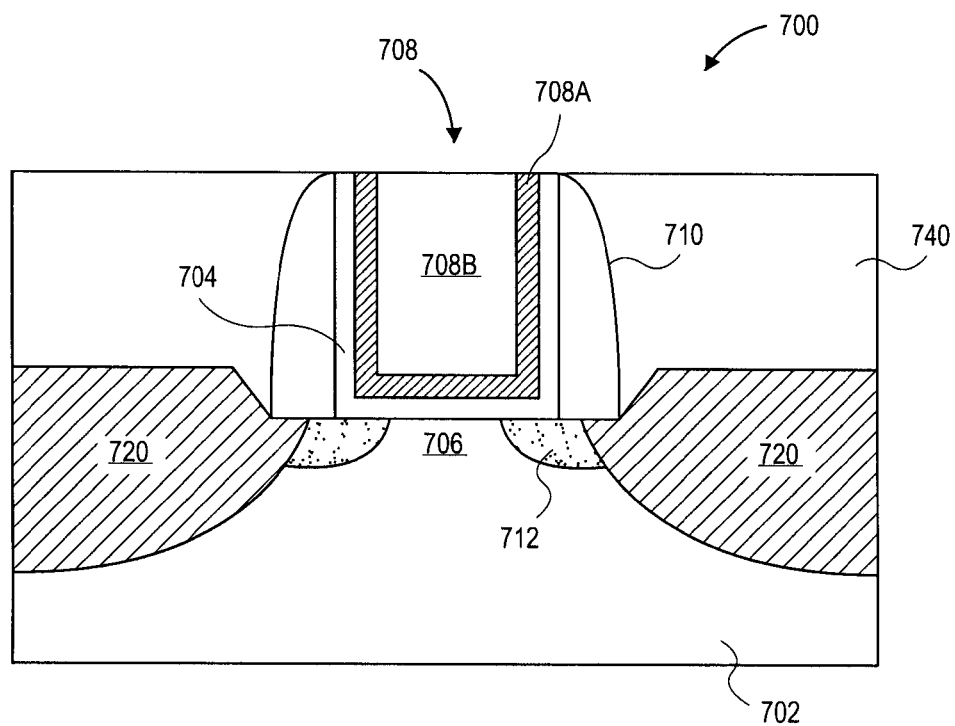
FIG. 7 depicts a metal oxide semiconductor field effect transistor (MOS-FET) including a cobalt-based metal gate electrode, in accordance with an embodiment of the present invention.

In an example, FIG. 7 depicts a metal oxide semiconductor field effect transistor (MOS-FET) 700 fabricated on a substrate 702, in accordance with an embodiment of the present invention. A gate dielectric layer 704 is disposed above a channel region 706, and a gate electrode 708 is disposed above gate dielectric layer 704. Gate dielectric layer 704 and gate electrode 708 may be isolated by gate isolation spacers 710. Tip extensions 712 may be formed by implanting dopant atoms into substrate 702. Source and drain regions, e.g., strain-inducing source/drain regions 720 may be formed by selectively growing an epitaxial film in etched-out portions of substrate 702 and are doped either in situ or after epitaxial film growth, or both. In an embodiment tip extensions 712 may be formed simultaneously with the source and drain regions to create "epi" tip extensions. In typical MOS-FETs, the channel region 706 is composed of a semiconductor material, such as single crystalline silicon. In an embodiment, the gate electrode 708 is a metal gate electrode, e.g., the workfunction of the gate electrode 700 is based on a metal or metal-containing layer. In one such embodiment, the metal gate electrode is composed, at least somewhat, of cobalt. For example, in a specific embodiment, the metal gate electrode 708 includes a cobalt-based workfunction setting layer 700A and an additional fill metal thereon 700B, as depicted in FIG. 7. In another specific embodiment, the entire gate electrode 708 is composed of a single cobalt-based material. In yet another specific embodiment, only a fill material 770B of the gate electrode 708 is cobalt-based, while a workfunction setting layer 700A dose not include cobalt. In any of these cases, the cobalt-based material or film is formed by a method described above. For example, the cobalt-based material or film is composed of at least 90% cobalt. In a specific such embodiment, the cobalt-based material or film is composed of a dilute alloy having approximately 0.25-5% of a non-cobalt element, with the remainder approximately 95+% cobalt.

Also, it is to be understood that the MOS-FET 700 may be a planar device or include a three-dimensional body, e.g., as in a double-gate, fin-fet, tri-gate, or gate-all-around transistor. As such, the substrate 702 may be a planar substrate or depict a cross-sectional view of a three-dimensional body. Furthermore, in one embodiment, the gate electrode 708, and specifically a metal gate electrode, may be fabricated using a replacement gate process where a dummy gate (such as a polycrystalline silicon or dielectric dummy gate) is exposed by a planarization process and then removed to form an opening. The opening is then filled with a metal gate (e.g., a metal gate electrode including cobalt). Any material formed above interlayer dielectric layer 740 during such a fill may subsequently be removed by chemical mechanical polishing (CMP). In such a replacement gate process flow, it is to be understood that the gate dielectric layer may also be replaced, resulting in a gate dielectric layer having sidewalls portions formed between the gate electrode 708 and spacers 710, as depicted in FIG. 7. Finally, it is to be understood that only several features of the MOS-FET 700 are depicted for clarity. It is to be understood that isolation layers, e.g., interlayer dielectric layer 740, and metallization routing layers used for integrating MOS-FET 700 into, e.g., an integrated circuit may also be included, as is well known in the art.

Figure 8:
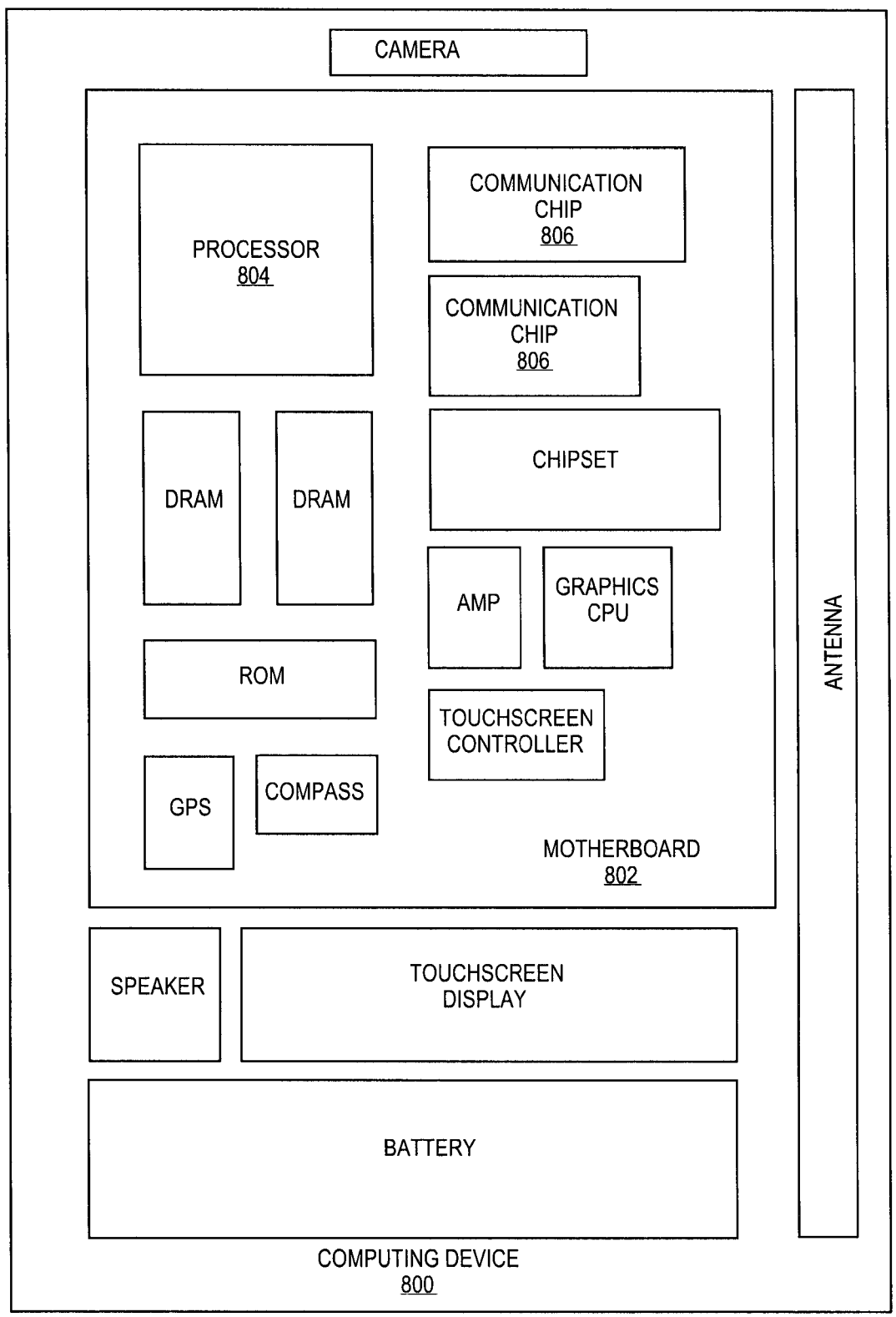
FIG. 8 illustrates a computing device in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more cobalt interconnects built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more cobalt interconnects built in accordance with implementations of the invention.

In further implementations, another component housed within the computing device 800 may contain an integrated circuit die that includes one or more cobalt interconnects built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

In utilizing the various aspects of this invention, it would become apparent to one skilled in the art that combinations or variations of the above embodiments are possible for forming a metal interconnect comprising cobalt and method of forming a metal interconnect comprising cobalt. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A method of forming a metal interconnect structure, comprising:
    forming an opening in a dielectric layer disposed on a substrate, wherein the opening exposes a conductive region of the substrate, wherein the conductive region is a semiconductor diffusion region;
    forming a seed layer directly on the dielectric layer in the opening, over the conductive region of the substrate, and by a first method comprising a first set of parameters, the seed layer comprising at least 50 atomic % cobalt and having a first grain structure;
    forming a fill material on a surface of the seed layer by a second method comprising a second set of parameters, wherein the first set of parameters is different than the second set of parameters, and wherein the fill material comprises 0.25-5 atomic % of a non-cobalt element with the remainder approximately 95+ atomic % cobalt, the fill material having a second grain structure larger than the first grain structure and having a composition different from the seed layer, wherein grain boundaries within the cobalt of the fill material are filled by the non-cobalt element; and
    removing portions of the fill material and the seed layer disposed above an upper surface of the dielectric layer.

2. The method of claim 1, where the first and second methods are the same methods.

3. The method of claim 1, wherein the first and second methods are different methods.

4. The method of claim 1, wherein the first method comprises a method selected from a group consisting of chemical vapor deposition (CVD), atomic layer deposition (ALD), and physical vapor deposition (PVD).

5. The method of claim 1, wherein the second method comprises a method selected from a group consisting of CVD, ALD, PVD, Electroplating, and Electro-less plating.

6. The method of claim 1, wherein the removing comprises chemical-mechanical polishing (CMP).

7. The method of claim 1, wherein the seed layer further comprises at least one element selected from the group consisting of silicon and germanium.

8. The method of claim 1, wherein the first method is conformal and the second method is non-conformal.

9. The method of claim 1, wherein the first method is a slow deposition and the second method is a fast deposition.

10. The method of claim 1, further comprising repeating a reflowing of the fill material and the forming the fill material until the opening is completely filled.

11. The method of claim 10, wherein the repeating is performed at least three times.

12. A metal interconnect structure, comprising:
    a dielectric layer disposed on a substrate;
    an opening disposed in the dielectric layer and exposing a conductive region in the substrate, the opening having a lower portion and an upper portion, the upper portion wider than the lower portion;
    a plug disposed in the lower portion of the opening the plug filling the lower portion of the opening, the plug comprising at least 50 atomic % cobalt and having a first grain structure; and
    a fill material disposed on the plug and in the upper portion of the opening, the fill material comprising 0.25-5 atomic % of a non-cobalt element with the remainder approximately 95+ atomic % cobalt, and the fill material having a second grain structure larger than the first grain structure and having a composition different from the plug, wherein grain boundaries within the cobalt of the fill material are filled by the non-cobalt element.

13. The metal interconnect structure of claim 12, wherein the plug further comprises at least one element selected from the group consisting of phosphorous and boron.

14. The metal interconnect structure of claim 12, further comprising a seed layer comprising cobalt disposed over the plug and on a surface of at least the upper portion of the opening.

15. The metal interconnect structure of claim 14, wherein the seed layer, the plug and the fill material have differing grain structure or composition.

16. A method of forming a metal interconnect structure, comprising:
    forming an opening in a dielectric layer disposed on a substrate, exposing a conductive region in the substrate, the opening having an upper portion and a lower portion, the upper portion wider than the lower portion;
    forming a plug over the conductive region of the substrate and within at least the lower portion of the opening by a first method comprising a first set of parameters, the plug material filling the lower portion of the opening, and the plug comprising at least 50 atomic % cobalt and having a first grain structure;
    forming a fill material over the plug, the dielectric layer, and within at least the upper portion of the opening by a second method comprising a second set of parameters, wherein the first set of parameters is different than the second set of parameters, the fill material comprising 0.25-5 atomic % of a non-cobalt element with the remainder approximately 95+ atomic % cobalt, the fill material having a second grain structure larger than the first grain structure and having a composition different from the plug, wherein grain boundaries within the cobalt of the fill material are filled by the non-cobalt element; and removing portions of the fill material disposed above an upper surface of the dielectric layer.

17. The method of claim 16, wherein the first method comprises a method selected from a group consisting of chemical vapor deposition (CVD), atomic layer deposition (ALD), and physical vapor deposition (PVD), and the second method comprises a method selected from a group consisting of Electroplating and Electro-less plating.

18. The method of claim 16, wherein the first and second methods are the same methods.

19. The method of claim 16, wherein the first and second methods are different methods.

* * * * *